United States Patent [19]

Metz

[11] 4,340,866
[45] Jul. 20, 1982

[54] THERMALLY-COMPENSATED VARIABLE GAIN DIFFERENTIAL AMPLIFIER

[75] Inventor: Arthur J. Metz, Gervais, Oreg.

[73] Assignee: Tektronix, Inc., Beaverton, Oreg.

[21] Appl. No.: 75,779

[22] Filed: Sep. 17, 1979

[51] Int. Cl.³ .............................................. H03F 3/45
[52] U.S. Cl. .................................. 330/254; 330/256; 330/278; 330/289
[58] Field of Search ................ 330/254, 256, 278, 289

[56] References Cited

U.S. PATENT DOCUMENTS 3,684,974  8/1972  Solomon ............................ 330/254
3,689,752  9/1972  Gilbert ............................... 364/841

Primary Examiner—Harold A. Dixon
Attorney, Agent, or Firm—George T. Noe

[57] ABSTRACT

A linear wideband differential amplifier includes a variable gain stage comprising two cross-coupled differential amplifiers and differential current source to compensate for thermal distortion, to minimize transient response distortion, and to eliminate signal attenuation at the center gain setting.

4 Claims, 1 Drawing Figure

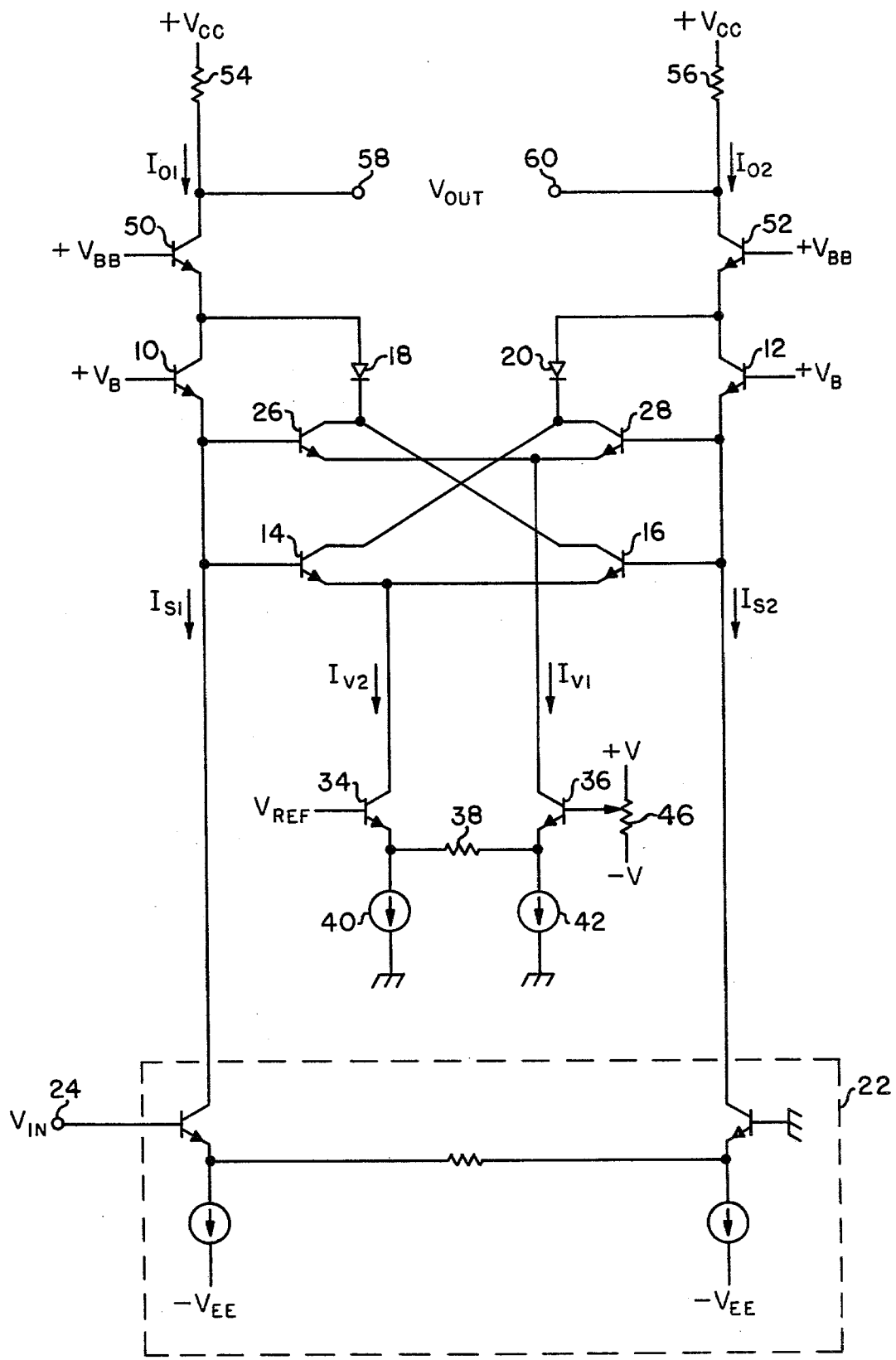

THERMALLY-COMPENSATED VARIABLE GAIN DIFFERENTIAL AMPLIFIER

BACKGROUND OF THE INVENTION

This invention relates to differential amplifiers in general, and in particular to a differential amplifier having a variable gain stage that is thermally compensated.

Differential amplifiers such as the integrated circuit gain cell taught by Gilbert in U.S. Pat. No. 3,689,752, which is assigned to the assignee of the present invention, have become popular in electronic instruments because of their linearized response and wideband capabilities. However, such amplifiers, particularly if utilized as variable gain amplifiers, are susceptible to thermal distortion and transient response problems that are a function of the gain setting. Further such amplifiers are susceptible to attenuation of a signal at the center gain setting.

SUMMARY OF THE INVENTION

According to the present invention, a linear wideband differential amplifier includes a variable gain stage which is arranged to compensate for thermal distortion, to minimize transient response distortion due to non-linearities of the active devices utilized, and to eliminate attenuation of the signal at the center gain setting.

The basic differential amplifier is in the gain cell configuration as taught by Gilbert wherein the collectors of an emitter-coupled pair of transistors having a gain-controlling current applied to the emitters thereof are cross-coupled to the collectors of a pair of input transistors, with the addition of a further pair of emitter-coupled compensation transistors, the bases and collectors of which are coupled respectively to emitters and collectors of the input pair of transistors, and the emitters of which are coupled to a complementary gain-current adjustment stage. The outputs of the compensation transistors act to oppose the outputs of the first-mentioned emitter-coupled transistors, cancelling the thermal errors and compensating for the transient response changes due to non-linearities of the first mentioned emitter-coupled transistors.

It is therefore one object of the invention to provide an improved linear wideband differential amplifier by the addition of a variable gain stage.

It is another object to provide linear wideband differential amplifier which exhibits reduced thermal distortion and minimized transient response distortion.

It is a further object to provide a differential amplifier in which signal attenuation is eliminated at the center gain stage.

Other objects and advantages of the present invention will become apparent upon a reading of the following description when taken in conjunction with the drawings.

BRIEF DESCRIPTION OF THE DRAWING

This single FIGURE is a schematic diagram of the preferred embodiment in accordance with the present invention.

DETAILED DESCRIPTION OF THE PREFERRED EMBODIMENT

In the single FIGURE, transistors 10, 12, 14, and 16 are connected in the gain cell configuration taught by Gilbert in U.S. Pat. No. 3,689,752. The emitters of transistors 14 and 16 are connected together, while the bases thereof are connected to the emitters of input transistors 10 and 12 respectively. The collector of transistor 16 is cross-coupled to the collector of transistor 10 via a diode 18, while the collector of transistor 14 is in a like manner cross-coupled to the collector of transistor 12 via a diode 20. The diodes 18 and 20 ensure identical collector-to-emitter operating voltages for transistors 10, 12, 14, and 16 (and for transistors 26 and 28 to be discussed below). The emitters of transistors 10 and 12 are connected to the outputs of a differential amplifier input stage 22, which produces complementary currents $I_{S1}$ and $I_{S2}$ in response to input signals applied to input terminal 24.

An additional pair of emitter-coupled transistors 26 and 28 is provided in parallel with transistors 14 and 16 between the emitters of transistors 10 and 12, with the base of transistor 26 connected to the emitter of transistor 10 and the base of transistor 28 connected to the emitter of transistor 12. The collector of transistor 26 is connected to the collector of transistor 16, and coupled via diode 18 to the collector of transistor 10. Likewise, the collector of transistor 28 is connected to the collector of transistor 14, and coupled via diode 20 to the collector of transistor 12. Transistors 26 and 28 are identical to transistors 14 and 16, have the same operating voltage, and the output currents therefrom oppose each other due to the cross-coupling.

A differential current source is provided to vary the ratio of emitter currents $I_{V1}$ and $I_{V2}$ of transistors 26–28 and 14–16 respectively. The differential current source comprises transistors 34 and 36, the emitters of which are coupled together through a resistor 38, and are returned to ground through constant current sinks 40 and 42, respectively. The collector of transistor 34 is connected to the emitters of transistors 14 and 16, while the collector of transistor 36 is connected to the emitters of transistors 26 and 28. The base of transistor 36 is connected to the wiper arm of a gain-setting potentiometer 46 to permit a variable adjustment of base voltage between two predetermined voltage levels + and −V. The base of transistor 34 is connected to a suitable source of reference voltage, $V_{REF}$, which is selected to correspond to the center voltage of potentiometer 46 to provide a point at which the differential current source is balanced so that $I_{V1} = I_{V2}$ at that point. As the outputs from the differential current source are shifted by adjustment of gain-setting potentiometer 46, the gains of emitter-coupled transistor amplifiers 14–16 and 26–28 are adjusted in a complementary manner to either add to or subtract from the input signal.

The overall adjustable current gain for the amplifier structure shown may be described by the equation (assumes $\alpha = 1$)

$$A_I = 1 + \frac{I_{V2} - I_{V1}}{I_{S1} + I_{S2}} \tag{1}$$

It can be seen from this equation that as gain-setting potentiometer 46 is adjusted throughout its range, the change in gain $A_1$ is linear and may thus be precisely controlled. Because of the self-compensating nature of the amplifier, transient response changes due to nonlinearities of the emitter-coupled transistors tend to cancel.

Since the amplifier shown employs all NPN transistors and a minimum of intervening components, it is preferably realized in integrated circuit form. Further, the ratio of the area of the various transistors may be precisely established, resulting in a complete cancellation of thermal distortion due to self-heating of the transistors. The ratio is $$\frac{\text{Area 1}}{\text{Area 2}} = \frac{I_{S1} + I_{S2}}{I_{V1} + I_{V2}} \quad (2)$$

where Area 1 is the total emitter area of transistors 10 and 12, and Area 2 is the total emitter area of each of the transistor pairs 14–16 and 26–28.

A cascode-connected output stage comprising transistors 50 and 52 operated as common-base amplifiers is connected to the collectors of transistors 10 and 12 to provide a very low impedance (ideally zero) load for transistors 10, 12, 14, 16, 26, and 28 to thereby prevent any variation in the collector voltage for these transistors. This stabilization, together with the symmetry of the amplifier structure and the proper area ratio discussed hereinabove, provides a linear wideband, variable gain differential amplifier in which errors due to thermal distortion are cancelled, transient response distortion due to nonlinearities of the active devices is minimized, and attenuation of the signal at the center gain setting is eliminated. The common-base transistors 50 and 52 also serve to further reduce the effects of thermal distortion in the lower transistors. The collectors of transistors 50 and 52 are connected through load resistors 54 and 56 to a suitable source of voltage $+V_{CC}$. Output currents $I_{01}$ and $I_{02}$ are available at the collectors of transistors 50 and 52 respectively and an output voltage may be taken between terminals 58 and 60.

While I have shown and described the preferred embodiment of my invention, it will be apparent to those skilled in the art that many changes and modifications may be made without departing from my invention in its broader aspects. I therefore intend that the appended claims cover all such changes and modifications as fall within the true spirit and scope of my invention.

I claim:

1. A thermal-compensated variable-gain differential amplifier, comprising:
    a pair of common-base amplifier input transistors for receiving input currents at the emitters thereof;
    a first emitter-coupled pair of transistors connected between the emitters of said pair of input transistors, the collectors of said first emitter-coupled pair of transistors being cross-coupled to the collectors of said input transistors;
    a second emitter-coupled pair of transistors connected between the emitters of said pair of input transistors, the collectors of said second emitter-coupled pair of transistors being coupled to the cross-coupled collectors of said first emitter-coupled pair of transistors and to the collectors of said pair of input transistors; and
    differential current generator means for providing first and second variably adjustable complementary operating currents, said first and second operating currents being provided to said first and second emitter-coupled pairs of transistors respectively.

2. An amplifier in accordance with claim 1 wherein the ratio of the emitter area of said pair of input transistors to either of said first and second emitter-coupled pairs of transistors is equal to ratio of the sum of said input currents to the sum of said operating currents.

3. An amplifier in accordance with claim 1 further including a pair of common-base amplifier output transistors connected to the collectors of said pair of common-base amplifier input transistors.

4. An amplifier in accordance with claim 1 further including means for providing substantially fixed and identical collector-to-emitter voltages for said pair of input transistors and said first and second emitter-coupled pairs of transistors.

* * * * *